United States Patent [19]
Saul et al.

[11] Patent Number: 5,425,843
[45] Date of Patent: Jun. 20, 1995

[54] PROCESS FOR SEMICONDUCTOR DEVICE ETCH DAMAGE REDUCTION USING HYDROGEN-CONTAINING PLASMA

[75] Inventors: Kenneth D. Saul, Palo Alto, Calif.; Valerie A. Bach, Philomath, Oreg.

[73] Assignee: Hewlett-Packard Corporation, Palo Alto, Calif.

[21] Appl. No.: 137,438

[22] Filed: Oct. 15, 1993

[51] Int. Cl.$^6$ .................. C23F 1/00; H01L 21/306
[52] U.S. Cl. .................. 156/643.1; 437/247; 437/937; 148/DIG. 3
[58] Field of Search ............ 156/643, 646; 437/238, 437/247, 72, 73, 937, 939; 148/DIG. 3, DIG. 24, DIG. 50

[56] References Cited

U.S. PATENT DOCUMENTS

| | | | |
|---|---|---|---|
| 4,331,486 | 5/1982 | Chenovas-Paule et al. | 148/1.5 |
| 4,897,154 | 1/1990 | Chakravarti et al. | 156/643 |
| 5,089,441 | 2/1992 | Moslehi | 437/225 |

OTHER PUBLICATIONS

S. J. Fonash et al., J. Appl. Phys. 58 (2), 15 Jul. 1985, pp. 862–866.

S. J. Fonash, Solid State Tech. 28 (5) 1-11 (1985).

*Primary Examiner*—Olik Chaudhuri
*Assistant Examiner*—Ken Horton

[57] ABSTRACT

A multi-layer structure, typically semiconductor device, is etched according to a process of the present invention, and meets the above-described existing needs by focusing on the post-etch treatment of the damaged, etched semiconductor device formed thereby. This post-etch treatment is accomplished by exposing the damaged silicon to a forming-gas downstream plasma which results in substantially increased oxide regrowth and significantly higher level of gate oxide quality. In conducting the process of the subject invention from about 1% up to about 15% by volume of $H_2$, and from about 85 up to about 99% by volume of $N_2$ are preferably employed as the post etching forming-gas plasma.

20 Claims, No Drawings

PROCESS FOR SEMICONDUCTOR DEVICE ETCH DAMAGE REDUCTION USING HYDROGEN-CONTAINING PLASMA

BACKGROUND OF THE INVENTION

This invention relates to a process for silicon etch damage reduction.

It is known in the prior art that the manufacture of semiconductor devices typically involves patterned etching using liquid or wet etching materials, such halogens or halogen-containing compounds, of certain layers which comprise features of these devices. For example, one well known etching material is chlorine which can exist in the etching process as either chlorine gas or HCl, etc. Chlorine etches the semiconductor isotropically, i.e., in both a lateral and vertical direction. This results in an etched feature which has a line width which is smaller than the resist image.

Etching can also be conducted in a gas phase using known techniques such as plasma etching, ion beam etching, and reactive ion etching. The use of gas plasma technology provides substantially anisotropic etching using gaseous ions, typically generated by an RF discharge. In gas plasma etching the requisite portion of the surface to be etched is removed by a chemical reaction between the gaseous ions and the subject surface. In the anisotropic process, etching takes place only or primarily in the vertical direction so that feature widths substantially match the photoresist pattern widths.

Semiconductor structures can include a layer of silicon dioxide grown and/or deposited on an underlying silicon substrate. However, plasma etching of silicon dioxide on silicon is known to cause silicon lattice damage due to bombardment effects of ions, energetic neutrals, radicals, and other plasma species. The effect of silicon damage has been determined to degrade gate oxide integrity and interfere with oxidation growth rates. Current techniques to reduce damage are focused on the etcher design and etch process parameters and are successful only to varying degrees.

Therefore, a need exists for a process which significantly reduces silicon etch damage that is detrimental to semiconductor device performance. Silicon damage after plasma etching has been linked to multiple integrated circuit fabrication problems such as incomplete oxide regrowth, silicide formation problems, contact resistance problems and many more.

SUMMARY OF THE INVENTION

A multi-layer structure, typically semiconductor device, is etched according to a process of the present invention, and meets the above-described existing needs by focusing on the post-etch treatment of the damaged, etched semiconductor device formed thereby. This post-etch treatment is accomplished by exposing the damaged silicon to a forming-gas downstream plasma which results in substantially increased oxide regrowth and significantly higher level of gate oxide quality.

More specifically, a process for post etching treatment of a damaged, etched semiconductor device is provided. The process comprises providing an unetched semiconductor device having a plurality of layers including a silicon dioxide layer deposited or grown on the surface of a silicon layer in an etching area. The unetched semiconductor device is then etched in the etching area with an etchant material to form an untreated etched semiconductor having a predetermined etched pattern therein. The etchant material is then reacted with the silicon dioxide layer of the untreated semiconductor device which damages the silicon layer by degrading gate oxide integrity and interfering with oxidation growth rates. Thereafter, the untreated etched semiconductor device including the damaged silicon layer is treated with a post etching forming-gas plasma comprising hydrogen and nitrogen. In this way, the damaged silicon layer undergoes a substantial increase in oxide regrowth and gate oxide integrity.

The post etching forming-gas plasma further preferably includes an inert gaseous material. More preferably, the inert gaseous material comprises helium or nitrogen.

The amount of damage to the damaged silicon layer incurred by the untreated semiconductor is preferably reduced to within about 25%, more preferably about 20%, and most preferably about 15% of the undamaged silicon layer, as measured by thermawave measurements, after treatment to form the treated semiconductor. Stated another way, the amount of damage, as measured by thermawave measurements, to the damaged silicon layer of the untreated semiconductor, was preferably reduced by at least about 50%, more preferably at least about 60%, and most preferably at least about 75%, after treatment to form the treated semiconductor.

The dielectric integrity of the treated etched semiconductor device is preferably at least about 4%, more preferably at least about 5%, and most preferably at least about 6% greater than the untreated etched semiconductor device. Moreover, the gate oxide integrity, as measured by comparing the percent reduction in failures at greater than a 20uA leakage limit for a standard ash process, has been preferably increased by at least about 4%, more preferably by at least about 5%, and most preferably at least about 6%. Furthermore, the oxide thickness of the treated semiconductor, as measured by optical or electric methods, has been preferably increased by at least about 50%, more preferably at least about 60%, and most preferably at least about 70% greater than an untreated counterpart semiconductor.

The process of the present invention is preferably conducted in a plasma etcher or a plasma asher apparatus. The aforementioned etcher or asher apparatus typically conducts the process of this invention at RF or microwave frequencies.

In conducting the process of the subject invention from about 1% up to about 15% by volume of $H_2$, and from about 85 up to about 99% by volume of $N_2$ are preferably employed as the post etching forming-gas plasma. A more preferred post etching forming-gas plasma comprises about 2 up to about 12% by volume of $H_2$, and from about 88 up to about 98% by volume of $N_2$ are preferably employed as the post etching forming-gas plasma, the most about 4 up to about 10% by volume of $H_2$, and from about 90 up to about 96% by volume of $N_2$ are preferably employed as the post etching forming-gas plasma.

The foregoing and other objects, features and advantages of the invention will become more readily apparent from the following detailed description of a preferred embodiment.

DETAILED DESCRIPTION OF A PREFERRED EMBODIMENT

EXAMPLE 1

The following experiments were conducted to determine the apparent damage and damage reduction with and without post treatment according the present invention.

A series of silicon wafers having a layer of silicon dioxide disposed thereon were introduced into a downstream single-wafer asher manufactured by GaSonics/IPC Corporation of San Jose, Calif. The wafers were subjected to a conventional gas plasma polymer removal step involving the use of an $O_2/N_2O$ chemical etchant. The etching conditions were as follows: 600W power, 700mT pressure, and a hot plate temperature of 250 degrees C. A top-surface heating lamp was applied at 350 watts for the first 20 seconds and a total etching time of 70 seconds. 500cc of $O_2$ and 30cc of $N_2O$ by volume were employed as the etchant chemical.

Some of these etched wafers were then subjected to a subsequent gas plasma treatment. Other wafers were not subsequently treated but were collected for comparison purposes. The treatment conditions were 600W power and 800 mT of vacuum. 900 sccm of a treatment gas plasma comprising 4%$H_2$/96%$N_2$, by volume, were introduced into the asher. A 500 watt top-surface heating lamp was maintained for four minutes followed by 0 watt lamp for an additional 4 minutes.

Thermawave measurements were made on three groups of untreated, etched wafers and etched wafers treated according to the process of the present invention, and the results compared to thermawave measurements made on three groups of prime, p-type, wafers which had not been subjected to either etching or to a subsequent treatment step. These results are shown in Table 1 below.

TABLE 1

| Group No.* | Post-Treatment | Etched | Thermowave Value |
|---|---|---|---|
| 1 | With $H_2/N_2$ | Yes | 134.2 |
| 1 | No Treatment | Yes | 356.1 |
| 1 | No Treatment | No | 35.4 |
| 2 | With $H_2/N_2$ | Yes | 132.0 |
| 2 | No Treatment | Yes | 368.4 |
| 2 | No Treatment | No | 34.7 |
| 3 | With $H_2/N_2$ | Yes | 129.1 |
| 3 | No Treatment | Yes | 361.6 |
| 3 | No Treatment | No | 34.7 |

*Group 1, 2, 3 = 40%, 60% and 70% overetch, respectively

The post-treatment by the process of this invention produced with $H_2$ and $N_2$ substantially reduced the amount of damage to the etched wafer, the resultant product having a three-fold decrease in the Thermawave Value as compared to a non-post-treated counterpart etched wafer.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A process for post etching treatment of a damaged etched semiconductor device, comprising:

providing an unetched semiconductor device having a plurality of layers including a silicon dioxide layer deposited or grown on the surface of a silicon layer in an etching area;

etching the unetched semiconductor device in the etching area with an etchant material to form an untreated etched semiconductor having an etched pattern therein, the etchant material reacting with the silicon dioxide layer of the untreated semiconductor device and thereby damaging the silicon layer by degrading gate oxide integrity and interfering with oxidation growth rates; and treating the untreated etched semiconductor device including the damaged silicon layer with a post etching forming-gas plasma comprising hydrogen and an inert gas and thereby increasing oxide regrowth and gate oxide integrity of the damaged silicon layer.

2. The process of claim 1, wherein said inert gaseous material comprise nitrogen.

3. The process of claim 1, wherein the inert gaseous material comprises helium.

4. The process of claim 1, wherein the amount of damage to the damaged silicon layer of the untreated semiconductor, as measured by thermawave measurements, is reduced to within about 25% of the undamaged silicon layer after treatment to form the treated semiconductor.

5. The process of claim 1, wherein the amount of damage, as measured by thermawave measurements, to the damaged silicon layer of the untreated semiconductor, was reduced by at least about 50% after treatment to form the treated semiconductor.

6. The process of claim 1, wherein gate oxide integrity, as measured by comparing the percent reduction in failures at greater than 20uA leakage limit for a standard ash process, is increased by at least about 4%.

7. The process of claim 1, wherein oxide thickness, as measured by optical or electric methods, is increased by at least about 50% as compared to the untreated etched semiconductor device including the damaged silicon layer.

8. The process of claim 1, wherein the process is conducted in a plasma asher apparatus.

9. The process of claim 1, wherein from about 1 up to about 15% by volume of $H_2$, and from about 85 up to about 99% by volume of $N_2$ are employed as the post etching forming-gas plasma.

10. The process of claim 1, wherein the dielectric integrity of the treated etched semiconductor device is 4% greater than the untreated etched semiconductor device.

11. A process for treating a damaged, etched multi-layer substrate, comprising:

forming an untreated damaged, etched multi-layer substrate having an etched pattern therein, the multi-layer comprising a plurality of layers including a silicon dioxide layer disposed on the surface of a silicon layer, the silicon layer being damaged during etching of the silicon dioxide layer thereby degrading the gate oxide integrity and interfering with oxidation growth rates of the untreated etched semiconductor device;

treating the untreated etched multi-layer structure including the damaged silicon layer with a post etching forming-gas plasma comprising hydrogen and an inert gas and thereby increasing oxide regrowth and gate oxide integrity of the damaged silicon layer to form a treated multi-layer structure.

12. The process of claim 11, wherein said inert gaseous material comprises nitrogen.

13. The process of claim 11, wherein the inert gaseous material comprises helium.

14. The process of claim 11, wherein the amount of damage to the damaged silicon layer of the untreated multi-layer structure, as measured by thermawave measurements, is reduced to within about 25% of the undamaged silicon layer after treatment to form the treated multi-layer structure.

15. The process of claim 11, wherein the amount of damage, as measured by thermawave measurements, to the damaged silicon layer of the untreated multi-layer structure, was reduced by at least about 50% after treatment to form the treated multi-layer structure.

16. The process of claim 11, wherein gate oxide integrity, as measured by comparing the percent reduction in failures at greater than 20uA leakage limit for a standard ash process, is increased by at least about 4%.

17. The process of claim 11, wherein the oxide thickness, as measured by optical or electric methods, is increased by at least about 50% as compared to the untreated etched semiconductor device including the damaged silicon layer.

18. The process of claim 11, wherein the process is conducted in a plasma asher apparatus.

19. The process of claim 11, wherein from about 1 up to about 15% by volume of $H_2$, and from about 85 up to about 99% by volume of $N_2$ are employed as the post etching forming-gas plasma.

20. The process of claim 11, wherein the dielectric integrity of the treated etched multi-layer structure is 4% greater than the untreated etched multi-layer structure.

* * * * *